United States Patent
Kakuho et al.

(10) Patent No.: US 9,873,574 B2
(45) Date of Patent: Jan. 23, 2018

(54) ELECTRONIC COMPONENT CONVEYANCE DEVICE AND METHOD OF MANUFACTURING TAPING ELECTRONIC COMPONENT ARRAY

(71) Applicant: MURATA MANUFACTURING CO., LTD., Kyoto-fu (JP)

(72) Inventors: Masaru Kakuho, Nagaokakyo (JP); Mitsuo Ebata, Nagaokakyo (JP); Naoto Tanaka, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/182,075

(22) Filed: Jun. 14, 2016

(65) Prior Publication Data

US 2016/0368715 A1  Dec. 22, 2016

(30) Foreign Application Priority Data

Jun. 16, 2015  (JP) ................. 2015-121299

(51) Int. Cl.
- *B65G 47/24* (2006.01)
- *B65G 54/02* (2006.01)
- *H05K 13/02* (2006.01)
- *B65G 51/03* (2006.01)

(52) U.S. Cl.
CPC .......... *B65G 54/02* (2013.01); *H05K 13/022* (2013.01); *H05K 13/028* (2013.01); *B65G 51/03* (2013.01); *B65G 2207/06* (2013.01)

(58) Field of Classification Search
CPC ............................ B65G 47/1485; B65G 47/24
USPC ....................... 198/381, 399, 402, 411, 689.1
See application file for complete search history.

(56) References Cited

U.S. PATENT DOCUMENTS

| | | | | |
|---|---|---|---|---|
| 5,600,906 A * | 2/1997 | Hamid | ................. | B65H 29/242 198/689.1 |
| 6,123,184 A * | 9/2000 | Yasuda | .............. | B65G 47/1485 198/381 |
| 2012/0138350 A1* | 6/2012 | Chae | .................... | H05K 13/021 174/260 |
| 2015/0129107 A1* | 5/2015 | Miyazaki | ................ | H01M 4/04 156/64 |

FOREIGN PATENT DOCUMENTS

JP  2011-018698 A  1/2011

* cited by examiner

*Primary Examiner* — Leslie A Nicholson, III
*Assistant Examiner* — Lester Rushin
(74) *Attorney, Agent, or Firm* — Studebaker & Brackett PC

(57) ABSTRACT

As an electronic component conveyance device that aligns a stack direction of internal electrodes in an electronic component in a highly reliable manner. An interval between a first sidewall and a second sidewall in a midstream part is larger than an interval P3 between the first sidewall and the second sidewall in a downstream part. A first magnetic force generation unit is provided lateral to the first sidewall in the midstream part. The height of a center of the first magnetic force generation unit with respect to a bottom surface is larger than P3/2.

17 Claims, 8 Drawing Sheets

ELECTRONIC COMPONENT CONVEYANCE DEVICE AND METHOD OF MANUFACTURING TAPING ELECTRONIC COMPONENT ARRAY

CROSS REFERENCE TO RELATED APPLICATIONS

This application claims benefit of priority to Japanese Patent Application 2015-121299 filed Jun. 16, 2015, the entire content of which is incorporated herein by reference.

TECHNICAL FIELD

The present disclosure relates to an electronic component conveyance device and a method of manufacturing a taping electronic component array.

BACKGROUND

A multilayer ceramic capacitor is a known electronic component. The multilayer ceramic capacitor includes a stack of a plurality of internal electrodes and ceramic dielectric layers.

The multilayer ceramic capacitor is typically mounted on a substrate for use. The mechanical strength or floating capacitance of the multilayer ceramic capacitor mounted on the substrate may differ depending on whether the stack direction of the internal electrodes is parallel to or vertical to the surface of the substrate.

In addition, the loudness of acoustic noise may differ depending on whether the stack direction of the internal electrodes is parallel to or vertical to the surface of the substrate. The "acoustic noise" is sound generated by oscillation of the substrate caused by distortion of the multilayer ceramic capacitor transferred to the substrate when the distortion occurs due to variation in applied voltage.

For these reasons, the multilayer ceramic capacitor is desirably mounted on the substrate with the stack direction of the internal electrodes being aligned in a predetermined direction.

JP 2011-018698 A discloses an exemplary electronic component conveyance device that aligns the multilayer ceramic capacitor in the predetermined direction. The conveyance device disclosed in JP 2011-018698 A includes a first conveyance path, a rotation path, and a second conveyance path. The rotation path is provided with a first magnet to apply magnetic force to an electronic component so that internal electrodes of the electronic component are aligned in a predetermined direction. The rotation path includes transition guide walls having an interval therebetween that gradually decreases toward an end connected with the second conveyance path.

The electronic component conveyance device disclosed in JP 2011-018698 A cannot reliably align the stack direction of the internal electrodes in the electronic component in some cases when the electronic component is conveyed at a high speed.

A main object of the present disclosure is to provide an electronic component conveyance device that aligns the stack direction of internal electrodes in an electronic component in a highly reliable manner.

SUMMARY

A first electronic component conveyance device according to the present disclosure includes a conveyance path and a first magnetic force generation unit. The conveyance path includes a midstream part and a downstream part connected with the midstream part. The conveyance path includes a bottom surface, a first sidewall, and a second sidewall defining (extending through) the midstream part and the downstream part. The first sidewall and the second sidewall face each other and are spaced apart with an interval. An interval P2 between the first sidewall and the second sidewall in the midstream part is larger than an interval P3 between the first sidewall and the second sidewall in the downstream part. The first magnetic force generation unit is provided lateral to the first sidewall in the midstream part. A height of a center of the first magnetic force generation unit with respect to the bottom surface is higher than P3/2. In the first electronic component conveyance device according to the present disclosure, the interval P2 between the first sidewall and the second sidewall in the midstream part is larger than the interval P3 between the first sidewall and the second sidewall in the downstream part. This facilitates rotation of an electronic component in the midstream part. Thus, the stack direction of internal electrodes in the electronic component is aligned in a highly reliable manner.

A second electronic component conveyance device according to the present disclosure includes a conveyance path and a first magnetic force generation unit. The conveyance path includes a midstream part and a downstream part connected with the midstream part. The conveyance path includes a bottom surface, a first sidewall, and a second sidewall defining the midstream part and the downstream part. The first sidewall and the second sidewall face each other and are spaced apart with an interval. An interval P2 between the first sidewall and the second sidewall in the midstream part is larger than an interval P3 between the first sidewall and the second sidewall in the downstream part. The first magnetic force generation unit is provided lateral to the first sidewall in the midstream part. A distance between a center of the first magnetic force generation unit and the bottom surface is larger than a distance between a center of an electronic component being conveyed and the bottom surface. As a result, the electronic component becomes separated off the bottom surface in the midstream part, and is likely to rotate. Thus, the stack direction of internal electrodes in the electronic component is aligned in a highly reliable manner.

The first and second electronic component conveyance devices according to the present disclosure each preferably further includes a second magnetic force generation unit provided lateral to the second sidewall in the midstream part. The second magnetic force generation unit is preferably arranged at a farther downstream side than the first magnetic force generation unit. This configuration can reduce jamming of the electronic component in the midstream part.

In each of the first and second electronic component conveyance devices according to the present disclosure, a distance between a center of the second magnetic force generation unit and the bottom surface is preferably smaller than the distance between the center of the first magnetic force generation unit and the bottom surface. This configuration can more effectively reduce jamming of an electronic component in the midstream part.

A third electronic component conveyance device according to the present disclosure includes a conveyance path and a first magnetic force generation unit. The conveyance path includes a bottom surface, a first sidewall, and a second sidewall. The first sidewall and the second sidewall face each other and are spaced apart with an interval. The first magnetic force generation unit is provided lateral to the first sidewall. The bottom surface has a separating structure that a portion of a lower surface of an electronic component being conveyed is spaced apart from the bottom surface. This facilitates rotation of the electronic component in the midstream part. Thus, the stack direction of internal electrodes in the electronic component is aligned in a highly reliable manner.

In the third electronic component conveyance device according to the present disclosure, the separating structure may be one of a protrusion defined by a portion of the bottom surface being protruded and a recess defined by a portion of the bottom surface being recessed.

In the third electronic component conveyance device according to the present disclosure, the separating structure may be such a level difference in the bottom surface that the bottom surface is lower on a downstream side.

In the third electronic component conveyance device according to the present disclosure, the separating structure may be a curved surface of the bottom surface.

A fourth electronic component conveyance device according to the present disclosure includes a conveyance path and a first magnetic force generation unit. The conveyance path includes a bottom surface, a first sidewall, and a second sidewall. The first sidewall and the second sidewall face each other and are spaced apart with an interval. The first magnetic force generation unit is provided lateral to the first sidewall. The fourth electronic component conveyance device according to the present disclosure further includes a floating mechanism that separates a portion of a lower surface of an electronic component being conveyed off the bottom surface by air pressure. As a result, the electronic component becomes separated off the bottom surface in the midstream part, and is likely to rotate. Thus, the stack direction of internal electrodes in the electronic component is aligned in a highly reliable manner.

In the fourth electronic component conveyance device according to the present disclosure, the floating mechanism may include a blowing mechanism that blows gas upwardly from the bottom surface.

In the third and fourth electronic component conveyance devices according to the present disclosure, the floating mechanism may include a suction mechanism that sucks the electronic component from above.

In the fourth electronic component conveyance device according to the present disclosure: the conveyance path may include a midstream part and a downstream part connected with the midstream part; the bottom surface, the first sidewall, and the second sidewall may define the midstream part and the downstream part; an interval P2 between the first sidewall and the second sidewall in the midstream part may be larger than an interval P3 between the first sidewall and the second sidewall in the downstream part; the first magnetic force generation unit may be provided lateral to the first sidewall in the midstream part; and the separating structure may be included in the bottom surface in the midstream part.

In the fourth electronic component conveyance device according to the present disclosure: the conveyance path may include a midstream part and a downstream part connected with the midstream part; the bottom surface, the first sidewall, and the second sidewall may define the midstream part and the downstream part; an interval P2 between the first sidewall and the second sidewall in the midstream part may be larger than an interval P3 between the first sidewall and the second sidewall in the downstream part; the first magnetic force generation unit may be provided lateral to the first sidewall in the midstream part; and the floating mechanism may be provided in the midstream part.

The fourth electronic component conveyance device according to the present disclosure preferably further includes a second magnetic force generation unit provided lateral to the second sidewall in the midstream part, and the second magnetic force generation unit is preferably arranged at a farther downstream side than the first magnetic force generation unit.

A method of manufacturing a taping electronic component array according to the present disclosure includes aligning stack directions of a plurality of internal conductors in the electronic components using the first or second electronic component conveyance device according to the present disclosure, and housing the electronic components of which the stack directions are aligned into recesses in a tape to obtain a taping electronic component array including the tape and the electronic components housed in the recesses.

The present disclosure can provide an electronic component conveyance device that aligns the stack direction of internal electrodes in an electronic component in a highly reliable manner.

DETAILED DESCRIPTION

Figure 1:
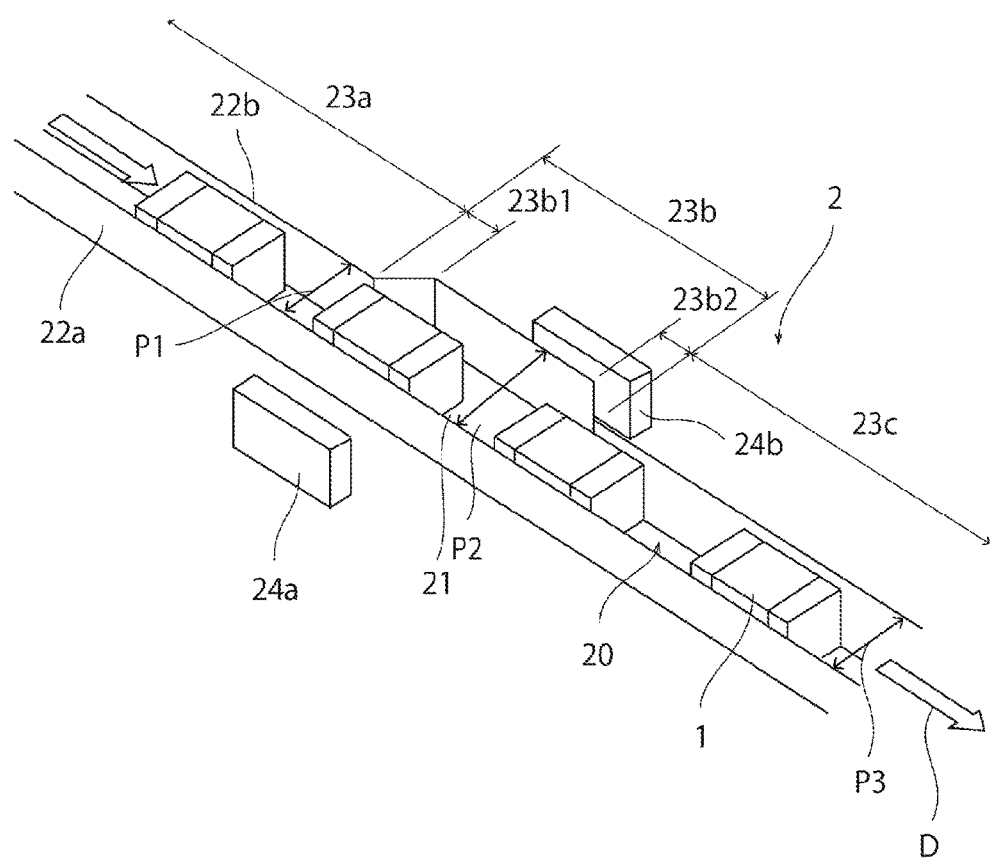
FIG. 1 is a schematic perspective view of a main part of an electronic component conveyance device according to a first embodiment.

Exemplary preferred embodiments of the present disclosure will be described below. The following embodiments, however, are merely examples. The present disclosure is not limited by the following embodiments.

In the accompanying drawings referred to in the embodiments and the like, members having substantially identical functions are denoted by an identical reference numeral. The drawings referred to in the embodiments and the like are schematically illustrated. The dimension, the ratio, and other parameters of an object illustrated in the drawings may be different from those of the object in reality. The dimension, the ratio, and other parameters of the object may be also different between the drawings. Specific values of the dimension, the ratio, and other parameters of the object should be determined according to the following description.

First Embodiment

Figure 2:
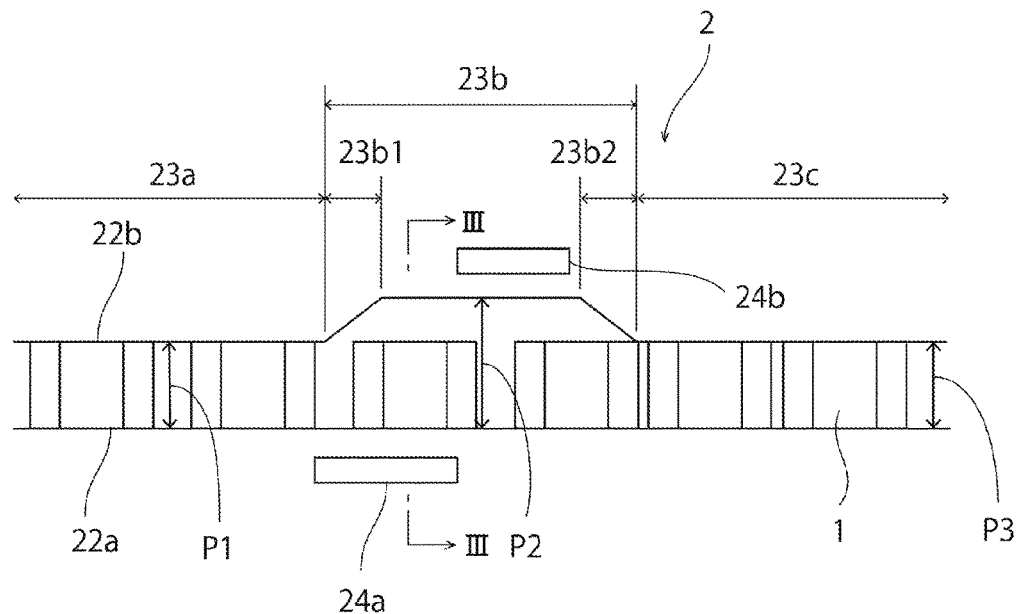
FIG. 2 is a schematic plan view of the main part of the electronic component conveyance device according to the first embodiment.

FIG. 1 is a schematic perspective view of a main part of an electronic component conveyance device according to the present embodiment. FIG. 2 is a schematic plan view of the main part of the electronic component conveyance device according to the present embodiment. The electronic component conveyance device 2 illustrated in FIGS. 1 and 2 conveys an electronic component 1. The electronic component 1 thus conveyed may be any rectangular parallelepiped.

Figure 6:
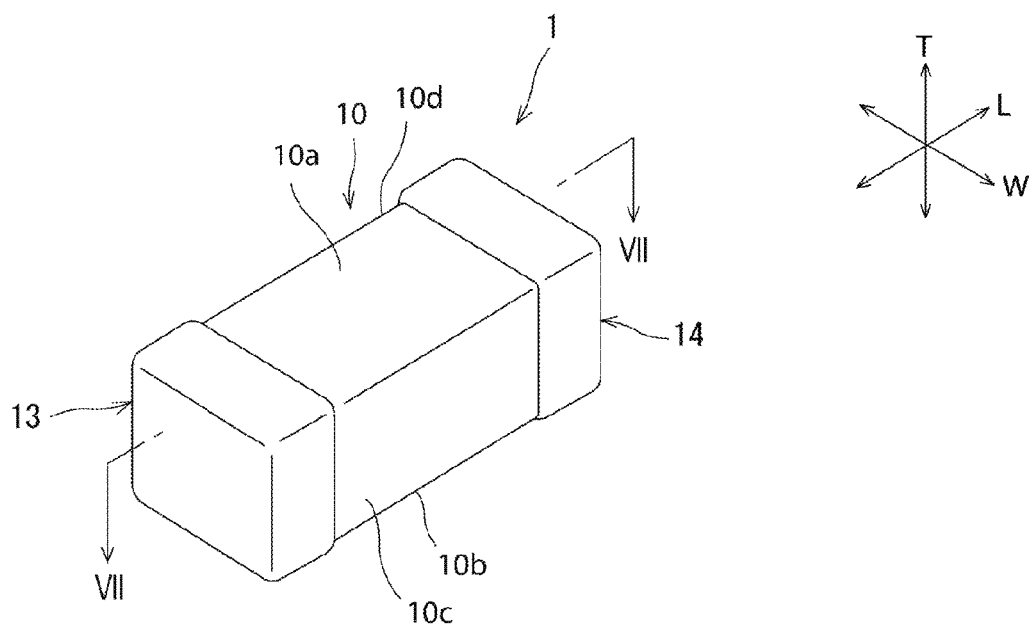
FIG. 6 is a schematic perspective view of an electronic component conveyed in the first embodiment.
Figure 7:
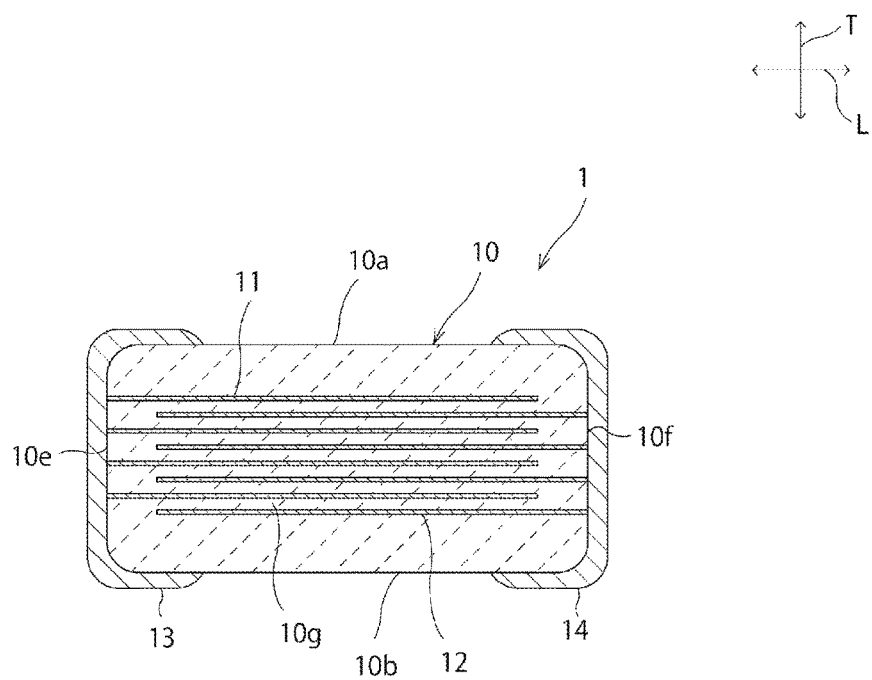
FIG. 7 is a schematic sectional view taken along line VII-VII in FIG. 6.

Specifically, the present embodiment describes an example in which the electronic component 1 illustrated in FIGS. 6 and 7 is conveyed by the electronic component conveyance device 2.

FIG. 6 is a schematic perspective view of the electronic component 1 conveyed in the present embodiment. FIG. 7 is a schematic sectional view taken along line VII-VII in FIG. 6.

The electronic component 1 illustrated in FIGS. 6 and 7 is a rectangular parallelepiped capacitor. Specifically, the electronic component 1 is a rectangular parallelepiped multilayer ceramic capacitor. The present disclosure is suitable for the electronic component 1 including a large capacitance that is likely to generate acoustic noise, especially for the electronic component 1 having a capacitance of 1 µF or larger or a capacitance of 10 µF or larger.

In the present disclosure, the electronic component is not limited to a capacitor. In the present disclosure, the electronic component may be a thermistor or an inductor, for example.

The electronic component 1 includes an electronic component body 10. The electronic component body 10 has a substantially rectangular parallelepiped shape. This substantially rectangular parallelepiped shape includes, in addition to a rectangular parallelepiped shape, the shape of a rectangular parallelepiped with rounded corners and edges.

The electronic component body 10 has a first main face 10a and a second main face 10b, a first side face 10c and a second side face 10d, and a first end face 10e and a second end face 10f (refer to FIG. 7). The first and second main faces 10a and 10b each extend in a length direction L and a width direction W. The length direction L and the width direction W are orthogonal to each other. The first and second side faces 10c and 10d each extend in the length direction L and a thickness direction T. The thickness direction T is orthogonal to the length direction L and the width direction W. The first and second end faces 10e and 10f each extend in the width direction W and the thickness direction T.

The dimension of the electronic component body 10 in the length direction L is larger than that in the width direction W and the thickness direction T. The dimension of the electronic component body 10 in the width direction W is substantially equal to the dimension of the electronic component body 10 in the thickness direction T. Specifically, the dimension of the electronic component body 10 in the width direction W is between 0.8 and 1.2 (inclusive) times as large as the dimension of the electronic component body 10 in the thickness direction T.

Specifically, in the present embodiment, the dimension of the electronic component body 10 in the length direction L is preferably between 0.6 mm and 2.0 mm inclusive. The dimension of the electronic component body 10 in the width direction W is preferably between 0.3 mm and 1.0 mm inclusive. The dimension of the electronic component body 10 in the thickness direction T is preferably between 0.3 mm and 1.0 mm inclusive.

The electronic component body 10 is made of ferroelectric ceramics to obtain a large capacitance. Specifically, examples of the dielectric ceramics include $BaTiO_3$, $CaTiO_3$, and $SrTiO_3$. To the electronic component body 10 may be added accessory components such as a Mn compound, a Mg compound, a Si compound, a Fe compound, a Cr compound, a Co compound, a Ni compound, and a rare earth compound, as appropriate, in response to characteristics required for the electronic component 1. The ferroelectric ceramics preferably has a relative permittivity of 2000 or larger, and more preferably has a relative permittivity of 3000 or larger. In this case, the capacitances of 1 µF or larger and 10 µF or larger can be achieved with the above-described dimension range of the electronic component body 10. The present disclosure is suitably applicable to the electronic component 1 that is likely to generate acoustic noise.

As illustrated in FIG. 7, a plurality of first internal electrodes 11 and a plurality of second internal electrodes 12 are provided as internal conductors inside the electronic component body 10.

The first internal electrodes 11 and the second internal electrodes 12 are alternately stacked in the thickness direction T, and face each other in the thickness direction T with a ceramic part 10g interposed therebetween. To increase the number of the internal electrodes 11 and 12, the ceramic part 10g preferably has a thickness of 1 µm or smaller. A too small thickness of the ceramic part 10g, however, may lead to a low voltage-proof characteristic. For this reason, the ceramic part 10g preferably has a thickness of 0.3 µm or larger. The total number of the internal electrodes 11 and 12 is preferably 350 or larger. An increase in the total volume of the internal electrodes 11 and 12 achieved by increasing the number thereof facilitates alignment of a stack direction of the internal electrodes in the electronic component 1.

The first internal electrodes 11 are provided in the length direction L and the width direction W. The first internal electrodes 11 are extended to the first end face 10e. The first internal electrodes 11 are not extended to the first and second main faces 10a and 10b, the first and second side faces 10c and 10d, and the second end face 10f.

The second internal electrodes 12 are provided in the length direction L and the width direction W. The second internal electrodes 12 are extended to the second end face 10f. The second internal electrodes 12 are not extended to the first and second main faces 10a and 10b, the first and second side faces 10c and 10d, and the first end face 10e.

The first and second internal electrodes 11 and 12 each contain metal, especially ferromagnetic metal. Specifically, examples of ferromagnetic metal preferably used include an alloy containing at least one of Ni, Fe, Ni, and Fe.

The first end face 10e is provided with a first external electrode 13. The first external electrode 13 extends from the first end face 10e to part of the first and second main faces 10a and 10b and part of the first and second side faces 10c and 10d. The first external electrode 13 is connected with the first internal electrodes 11 at the first end face 10e.

The second end face 10f is provided with a second external electrode 14. The second external electrode 14 extends from the second end face 10f to part of the first and second main faces 10a and 10b and part of the first and second side faces 10c and 10d. The second external electrode 14 is connected with the second internal electrodes 12 at the second end face 10f.

The first and second external electrodes 13 and 14 each contain at least one of Pt, Au, Ag, Cu, Ni, and Cr, for example.

The following describes the electronic component conveyance device 2 in detail with reference to FIGS. 1 to 5.

Figure 8:
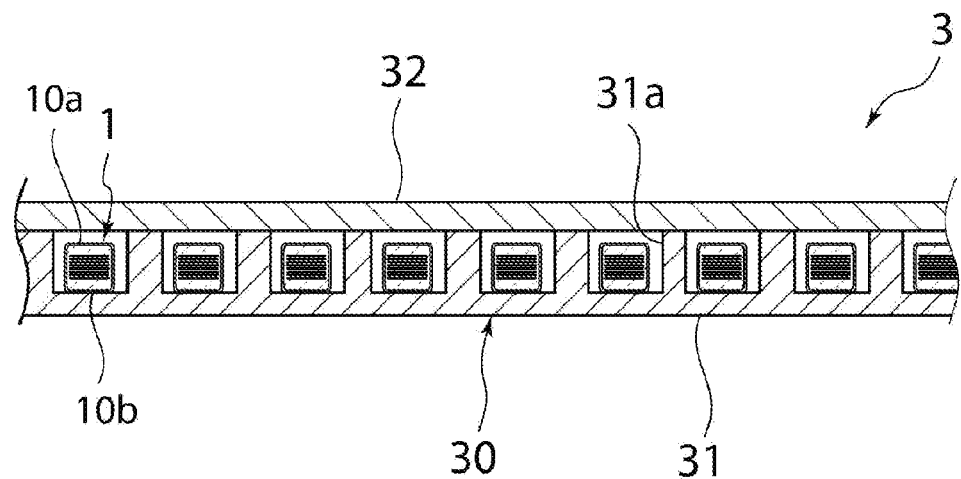
FIG. 8 is a schematic sectional view of a taping electronic component array manufactured in the first embodiment.

The electronic component conveyance device 2 includes a conveyance path 20. The conveyance path 20 is connected with a housing unit (not illustrated) that houses a plurality of electronic components 1 and supplies each electronic component 1 onto the conveyance path 20. The electronic component 1 conveyed in the conveyance path 20 is inserted, by an inserting unit not illustrated, into each of a plurality of recesses 31a provided separately from each other in an elongate carrier tape 31 illustrated in FIG. 8. Thereafter, a cover tape 32 is placed on the carrier tape 31. Thus, a taping electronic component array 3 is manufactured that includes a tape 30 including the carrier tape 31 and the cover tape 32, and the electronic components 1 housed in the recesses 31a.

As illustrated in FIGS. 1 and 2, the electronic components 1 are conveyed in the length direction L in the conveyance path 20.

The conveyance path 20 has a bottom surface 21, a first sidewall 22a, and a second sidewall 22b. The bottom surface 21 is horizontally provided. The first sidewall 22a extends upwardly from one side edge of the bottom surface 21 in the width direction thereof. The first sidewall 22a is vertical to the bottom surface 21. The second sidewall 22b extends upwardly from the other side edge of the bottom surface 21 in the width direction thereof. The second sidewall 22b is vertical to the bottom surface 21.

The conveyance path 20 has an upstream part 23a, a midstream part 23b connected with the upstream part 23a, and a downstream part 23c connected with the midstream part 23b. The upstream part 23a, the midstream part 23b, and the downstream part 23c are provided in this order from the housing unit (upstream) toward the inserting unit (downstream). The bottom surface 21, the first sidewall 22a, and the second sidewall 22b extend through the upstream part 23a, the midstream part 23b, and the downstream part 23c.

In the upstream part 23a and the downstream part 23c, the first sidewall 22a and the second sidewall 22b are provided at such an interval therebetween that the electronic component 1 is not rotatable about the length direction L. In other words, when the electronic component 1 has a dimension W1 in the width direction W and a dimension T1 in the thickness direction T, intervals P1 and P3 between the first sidewall 22a and the second sidewall 22b in the upstream part 23a and the downstream part 23c, respectively, are larger than W1 and T1 and smaller than $\{(W1)^2+(T1)^2\}^{1/2}$.

An interval P2 between the first sidewall 22a and the second sidewall 22b in the midstream part 23b is larger than the intervals P1 and P3 between the first sidewall 22a and the second sidewall 22b in the upstream part 23a and the downstream part 23c, respectively. Specifically, in the midstream part 23b, the first sidewall 22a and the second sidewall 22b are provided at such an interval therebetween that the electronic component 1 is rotatable about the length direction L. In other words, the interval P2 between the first sidewall 22a and the second sidewall 22b in the midstream part 23b is larger than $\{(W1)^2+(T1)^2\}^{1/2}$.

The midstream part 23b includes a first transition part 23b1 connected with the upstream part 23a. In the first transition part 23b1, the second sidewall 22b is tilted with respect to a conveyance direction D. The first sidewall 22a is parallel to the conveyance direction D and is flat (plane) in the upstream part 23a and the midstream part 23b. Thus, in the first transition part 23b1, the first sidewall 22a and the second sidewall 22b have an interval therebetween that gradually increases further away from the upstream part 23a.

The midstream part 23b includes a second transition part 23b2 connected with the downstream part 23c. In the second transition part 23b2, the second sidewall 22b is tilted with respect to the conveyance direction D. The first sidewall 22a is parallel to the conveyance direction D and is flat (plane) in the midstream part 23b and the downstream part 23c. Thus, in the second transition part 23b2, the first sidewall 22a and the second sidewall 22b have an interval therebetween that gradually decreases closer to the downstream part 23c.

The electronic component conveyance device 2 includes a first magnetic force generation unit 24a and a second magnetic force generation unit 24b. In the present disclosure, however, the electronic component conveyance device may include the first magnetic force generation unit only.

The first magnetic force generation unit 24a and the second magnetic force generation unit 24b each generate magnetic force. The first magnetic force generation unit 24a and the second magnetic force generation unit 24b may each include a permanent magnet or an electromagnet, for example.

The first magnetic force generation unit 24a is provided lateral to the first sidewall 22a. In the midstream part 23b, the first magnetic force generation unit 24a applies magnetic force to the electronic component 1 so that the stack direction of the plurality of internal electrodes (internal conductors) 11 and 12 in the electronic component 1 (hereinafter simply referred to as a "stack direction of the electronic component 1") is aligned with a predetermined direction (a predetermined desirable constant direction, the horizontal direction, or the vertical direction). Specifically, when the electronic component 1 of which the stack direction is aligned with the predetermined direction is conveyed from the upstream part 23a, the magnetic force applied by the first magnetic force generation unit 24a does not change (rotate) the stack direction of the electronic component 1. In contrast, when the electronic component 1 of which the stack direction intersects with the predetermined direction is conveyed from the upstream part 23a, the magnetic force by the first magnetic force generation unit 24a is applied to the electronic component 1, so that the electronic component 1 rotates about an axis extending in the length direction L. As a result, the stack direction of the electronic component 1 becomes aligned with the predetermined direction. Accordingly, the electronic component 1 is conveyed in the downstream part 23c with its stack direction being aligned with the predetermined direction. This is a process performed in the midstream part 23b to align the stack direction of the electronic component 1. The electronic component 1 of which the stack direction is aligned is then conveyed to the downstream part 23c.

The second magnetic force generation unit 24b is provided lateral to the second sidewall 22b in the midstream part 23b and downstream of the first magnetic force generation unit 24a. Magnetic Force generated by the second magnetic force generation unit 24b is weaker than the magnetic force generated by the first magnetic force generation unit 24a. When the second magnetic force generation unit 24b is provided in this arrangement, the attractive force applied by the second magnetic force generation unit 24b facilitates separation of the electronic component 1 passing by the first magnetic force generation unit 24a off the first sidewall 22a, and thus rotation of the electronic component 1. In order to facilitate rotation of the electronic component 1 in this manner, the first magnetic force generation unit 24a and the second magnetic force generation unit 24b are preferably not opposite to each other, in other words, do not overlap with each other in a width direction orthogonal to the conveyance direction D. Specifically, the first magnetic force generation unit 24a preferably does not overlap with other magnetic force generation units including the second magnetic force generation unit 24b, and the second magnetic force generation unit 24b preferably does not overlap with other magnetic force generation units including the first magnetic force generation unit 24a.

When in contact with the bottom surface and the sidewalls, for example, the electronic component is unlikely to be rotated by the magnetic force applied by the first magnetic force generation unit. As a result, the stack direction of the internal electrodes in the electronic component is potentially not aligned in a reliable manner.

Figure 3:
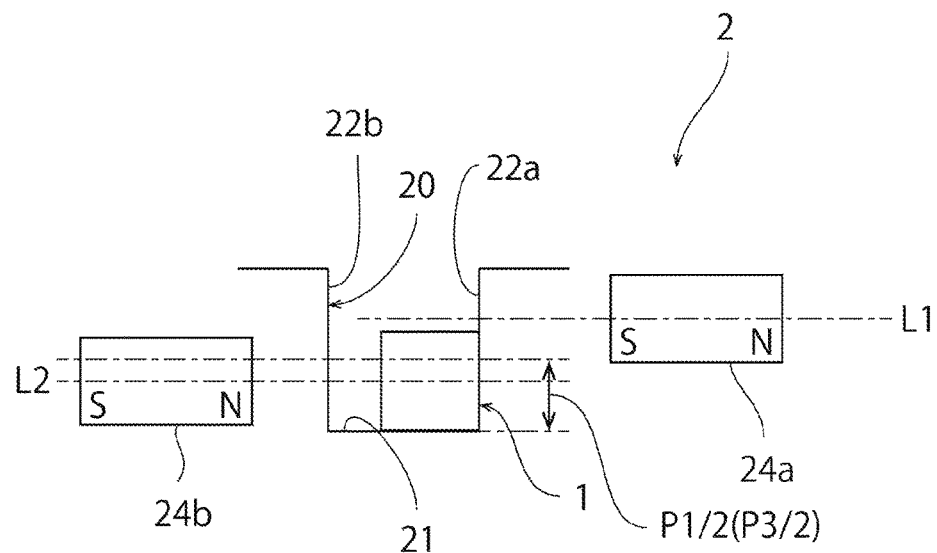
FIG. 3 is a schematic sectional view taken along line III-III in FIG. 2.
Figure 4:
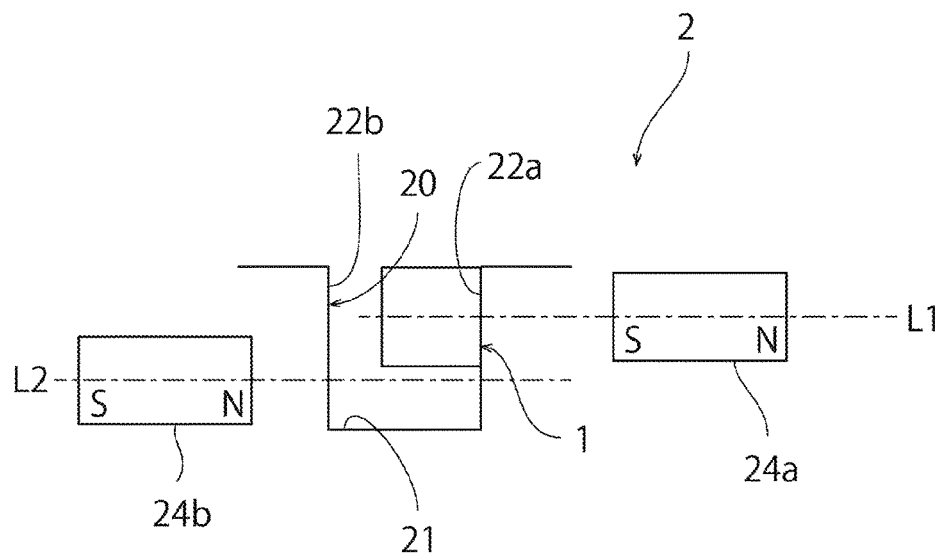
FIG. 4 is a schematic sectional view taken along line III-III in FIG. 2.
Figure 5:
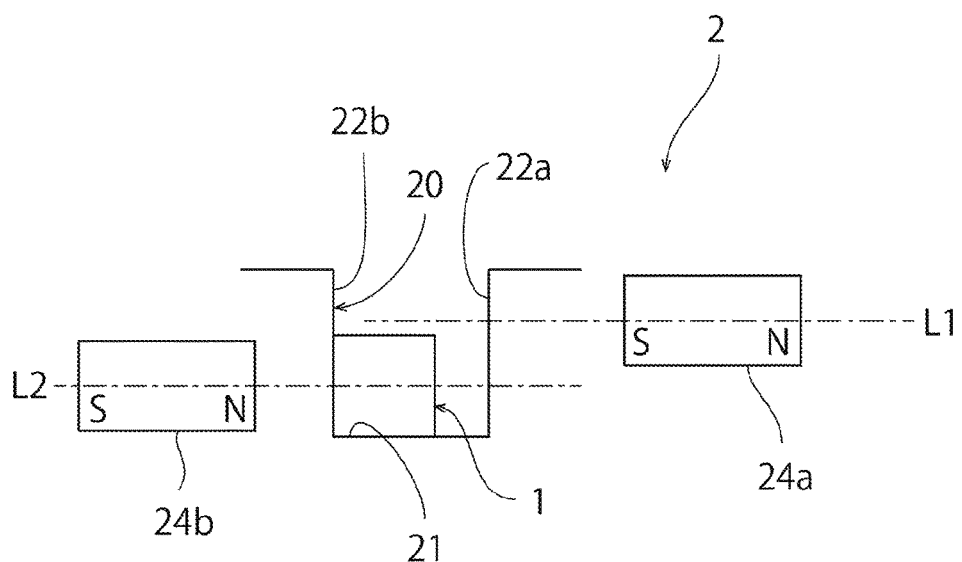
FIG. 5 is a schematic sectional view taken along line III-III in FIG. 2.

The electronic component conveyance device 2 has such a configuration that a lower surface (opposite to the bottom surface 21) of the electronic component 1 becomes partially separated off the bottom surface 21 of the conveyance path 20, (that is, a portion of a lower surface of the electronic component 1 being conveyed is spaced apart from the bottom surface 21), due to the magnetic force applied by the first magnetic force generation unit 24a in the midstream part 23b. Specifically, as illustrated in FIGS. 3 to 5, the first magnetic force generation unit 24a is provided such that the center of the first magnetic force generation unit 24a is positioned higher than the center of the electronic component 1 in contact with the bottom surface 21 of the conveyance path 20. Thus, a center line L1 of the first magnetic force generation unit 24a is positioned higher than a center line L2 extending in the width direction W of the electronic component 1. In other words, the height of the center of the first magnetic force generation unit 24a with respect to the bottom surface 21 is larger than P1/2 or P3/2, where P1 represents the interval between the first sidewall 22a and the second sidewall 22b in the upstream part 23a and P3 represents the interval thereof in the downstream part 23c. When the height of the center of the first magnetic force generation unit 24a with respect to the bottom surface 21 is larger than P1/2 or P3/2, the distance between the center of the first magnetic force generation unit 24a and the bottom surface 21 is larger than the distance between the center of the electronic component 1 and the bottom surface 21. Thus, as illustrated in FIG. 4, in the midstream part 23b, in which the first magnetic force generation unit 24a is provided, the lower surface of the electronic component 1 becomes partially separated off the bottom surface 21, so that the electronic component 1 is likely to rotate. As a result, the stack direction of the internal electrodes 11 and 12 in the electronic component 1 is likely to be aligned.

In contrast, as illustrated in FIG. 5, the center of the second magnetic force generation unit 24b is closer to the bottom surface 21 than the center of the first magnetic force generation unit 24a. In other words, the distance between the center of the second magnetic force generation unit 24b and the bottom surface 21 is smaller than the distance between the center of the first magnetic force generation unit 24a and the bottom surface 21. The second magnetic force generation unit 24b is provided such that the center of the second magnetic force generation unit 24b is substantially at the same height as that of the center of the electronic component 1 in contact with the bottom surface 21 or lower than the center of the electronic component 1. Accordingly, since the electronic component 1 comes into contact with both of the second sidewall 22b and the bottom surface 21 in a region of the conveyance path 20, in which the second magnetic force generation unit 24b is provided, the electronic component 1 is likely to have a stable orientation. Thus, the electronic component 1 is unlikely to jam in the midstream part 23b.

Similarly to the first magnetic force generation unit 24a, the second magnetic force generation unit 24b may be provided such that the lower surface of the electronic component 1 becomes partially separated off the bottom surface 21 of the conveyance path 20 due to the magnetic force applied by the second magnetic force generation unit 24b in the midstream part 23b.

The following describes other preferred embodiments of the present disclosure. In the following description, a member having substantially the same function as that in the first embodiment is denoted with the same reference numeral, and description thereof will be omitted.

Second to Eighth Embodiments

FIGS. 9 to 15 are each a schematic sectional view of a main part of an electronic component conveyance device according to second to eight embodiments.

The first embodiment describes the example in which the first magnetic force generation unit 24a is provided such that the lower surface of the electronic component 1 becomes partially separated off the bottom surface 21 due to the magnetic force applied by the first magnetic force generation unit 24a in the midstream part 23b, thereby facilitating rotation of the electronic component 1. However, the present disclosure is not limited to this configuration. Another method may be applied to partially separate the lower surface of the electronic component 1 off the bottom surface 21. For example, the bottom surface 21 may have a separating structure 40 that partially separates the lower surface of the electronic component 1 off the bottom surface 21 of the conveyance path 20 in the midstream part. In this case also, similarly to the first embodiment, the electronic component 1 is likely to rotate in the midstream part 23b. Accordingly, the stack direction of the internal electrodes 11 and 12 in the electronic component 1 is aligned in a highly reliable manner.

Figure 9:
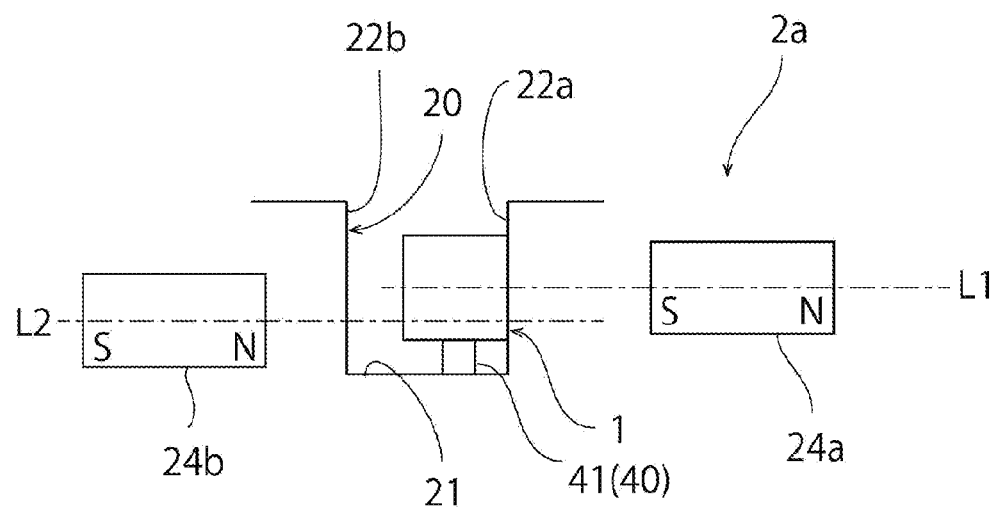
FIG. 9 is a schematic sectional view of a main part of an electronic component conveyance device according to a second embodiment.

As an example, in an electronic component conveyance device 2a according to the second embodiment illustrated in FIG. 9, a protrusion 41 extending upwardly from the bottom surface 21 is provided as the separating structure 40. When the protrusion 41 is positioned lower than the electronic component 1, the lower surface of the electronic component 1 is likely to partially separate off the bottom surface 21 and the electronic component 1 is likely to rotate.

Figure 10:
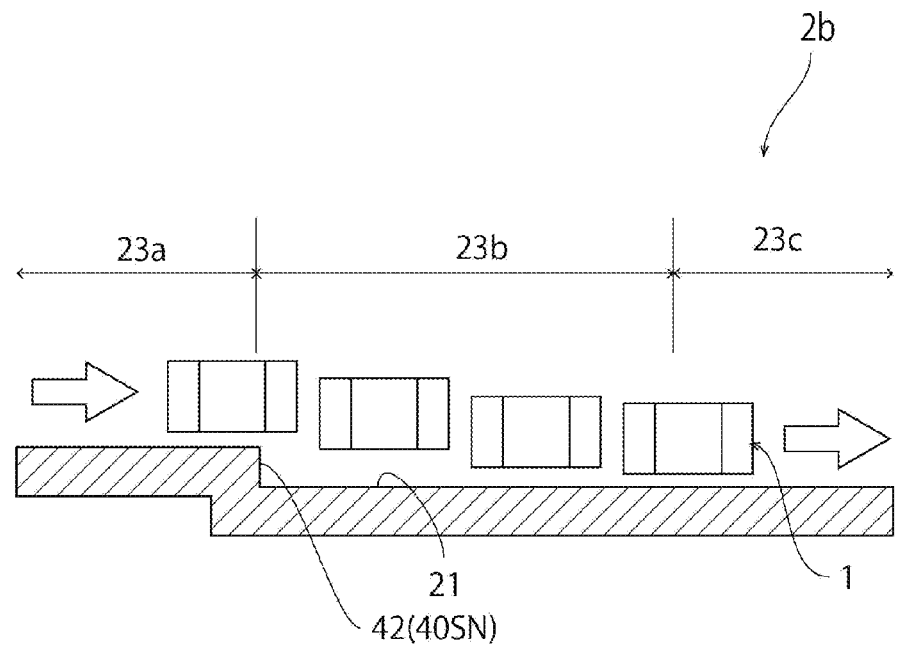
FIG. 10 is a schematic sectional view of a main part of an electronic component conveyance device according to a third embodiment.

As another example, an electronic component conveyance device 2b according to the third embodiment illustrated in FIG. 10 has the separating structure 40 that the bottom surface 21 is provided with such a level difference 42 that the bottom surface is lower on a downstream side. The lower surface of the electronic component 1 is likely to become partially separated off the bottom surface 21 immediately after the electronic component 1 has passed the level difference 42, and the electronic component 1 is likely to rotate.

Figure 11:
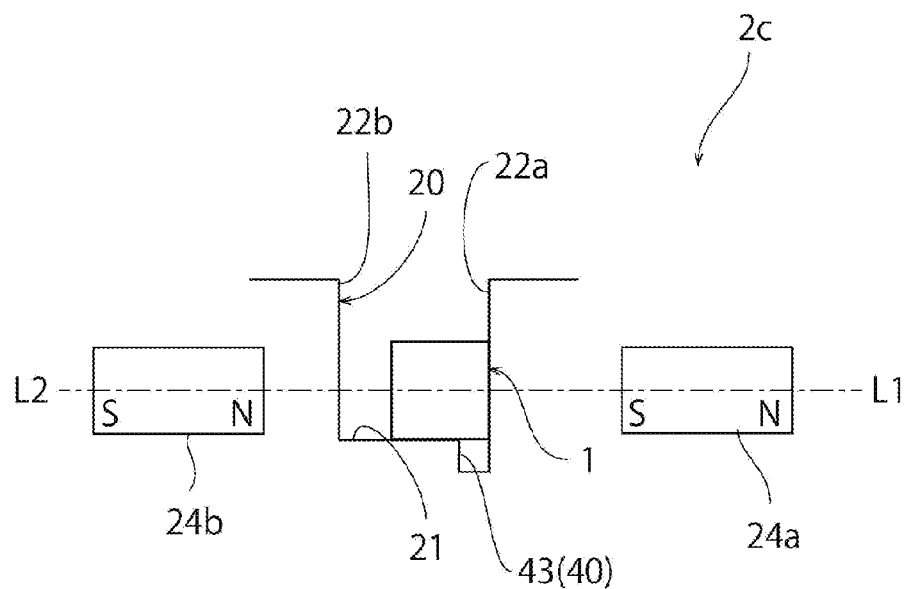
FIG. 11 is a schematic sectional view of a main part of an electronic component conveyance device according to a fourth embodiment.

As another example, an electronic component conveyance device 2c according to the fourth embodiment illustrated in FIG. 11 has the separating structure 40 that the bottom surface 21 is provided with a recess 43. The recess 43 is provided on an extended line of the first sidewall 22a. When the recess 43 is positioned lower than the electronic component 1, the lower surface of the electronic component 1 is likely to partially separate off the bottom surface 21 and the electronic component 1 is likely to rotate.

Figure 12:
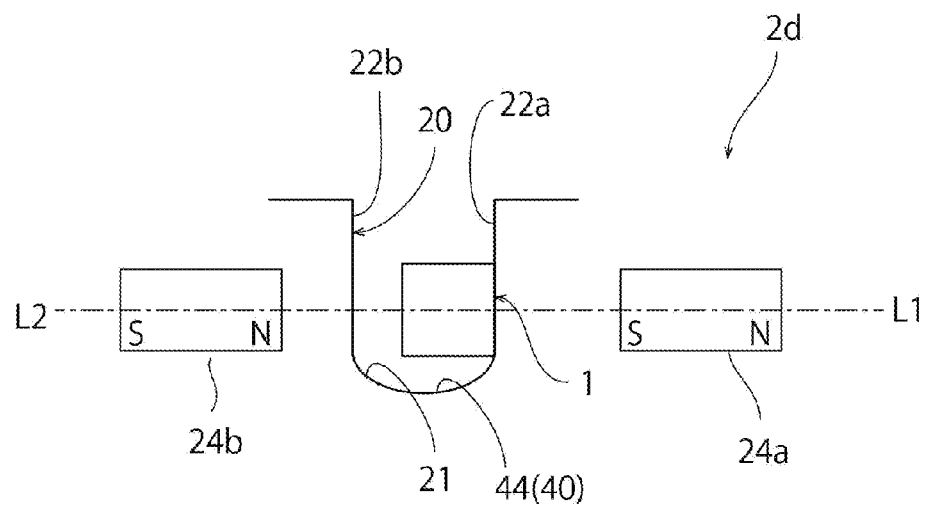
FIG. 12 is a schematic sectional view of a main part of an electronic component conveyance device according to a fifth embodiment.

As another example, an electronic component conveyance device 2d according to the fifth embodiment illustrated in FIG. 12 has the separating structure 40 that the bottom surface 21 includes a curved surface part 44. Specifically, in the present embodiment, the entire bottom surface 21 in the midstream part is the curved surface part 44. When the curved surface part 44 is positioned lower than the electronic component 1, the lower surface of the electronic component 1 is likely to partially separate off the bottom surface 21 and the electronic component 1 is likely to rotate.

Figure 13:
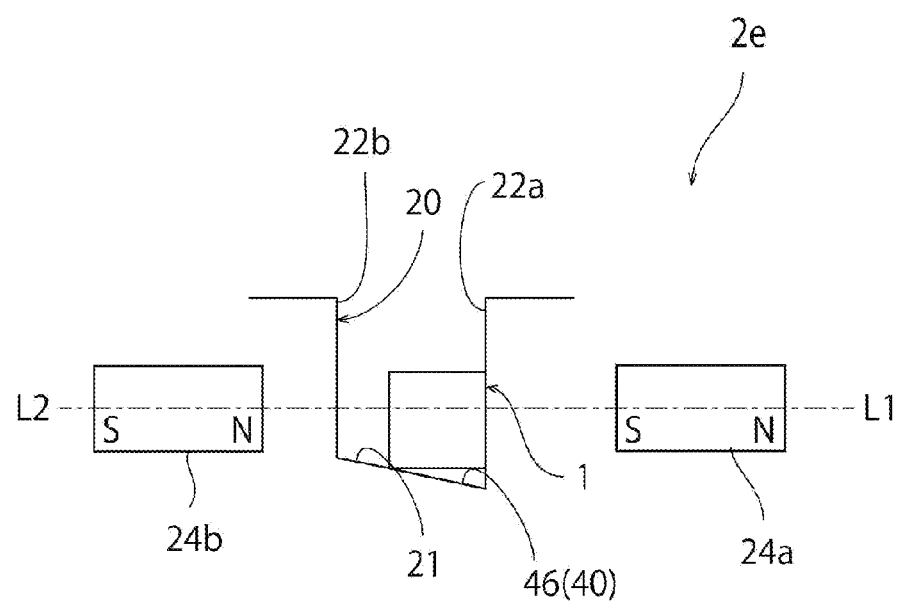
FIG. 13 is a schematic sectional view of a main part of an electronic component conveyance device according to a sixth embodiment.

As another example, an electronic component conveyance device 2e according to the sixth embodiment illustrated in FIG. 13 has the separating structure 40 that the bottom surface 21 includes a tilted surface 46 tilted with respect to the horizontal plane. An angle between the first sidewall 22a and the bottom surface 21 is smaller than 90°, and an angle between the second sidewall 22b and the bottom surface 21 is larger than 90°. In the present embodiment, too, the lower surface of the electronic component 1 becomes partially separated off the bottom surface 21, and thus the electronic component 1 is likely to rotate. When the angle between the first sidewall 22a and the bottom surface 21 is larger than 90°, the angle between the second sidewall 22b and the bottom surface 21 may be smaller than 90°.

Figure 14:
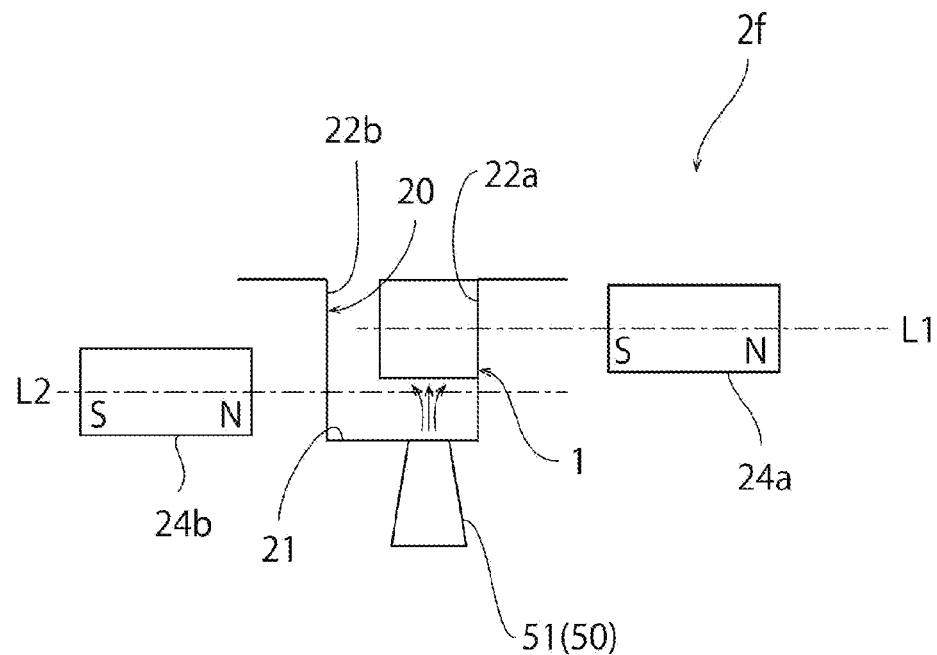
FIG. 14 is a schematic sectional view of a main part of an electronic component conveyance device according to a seventh embodiment.

As another example, an electronic component conveyance device 2f according to the seventh embodiment illustrated in FIG. 14 may further include a floating mechanism 50 that partially separates the lower surface of the electronic component 1 off the bottom surface 21 of the conveyance path 20 in the midstream part by air pressure. The floating mechanism 50 is provided with a blowing mechanism 51 that blows gas from the bottom surface 21 toward the electronic component 1 positioned above. The gas (air) blown by the blowing mechanism 51 facilitates partial separation of the lower surface of the electronic component 1 off the bottom surface 21 and rotation of the electronic component 1.

Figure 15:
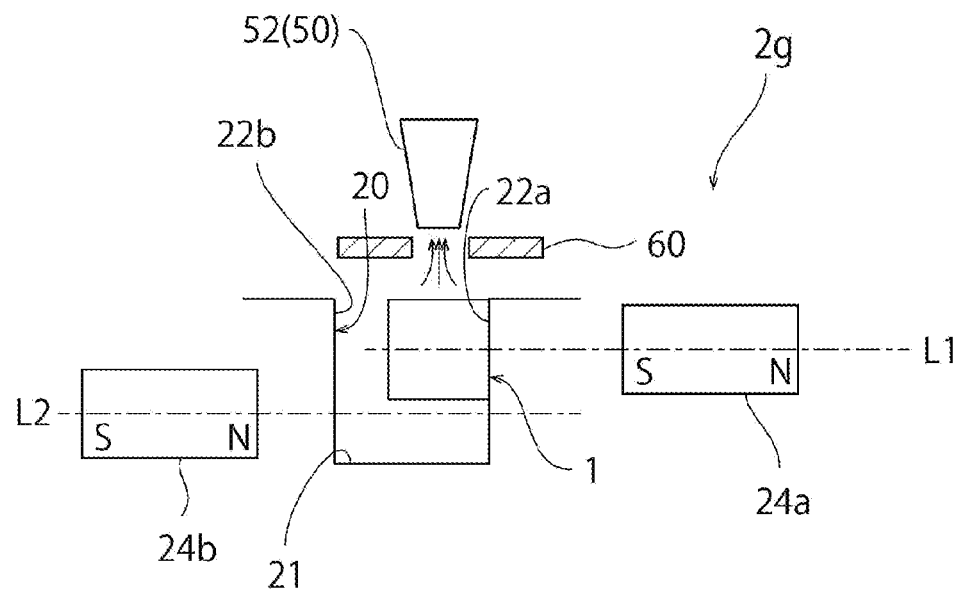
FIG. 15 is a schematic sectional view of a main part of an electronic component conveyance device according to an eighth embodiment.

As another example, an electronic component conveyance device 2g according to the eighth embodiment illustrated in FIG. 15 is provided with, as the floating mechanism 50, a suction mechanism 52 that sucks, from above, the electronic component 1 being conveyed in the midstream part. The suction of the electronic component 1 by the suction mechanism 52 facilitates partial separation of the lower surface of the electronic component 1 off the bottom surface 21 and rotation of the electronic component 1. The suction mechanism 52 is preferably provided with a cover 60 having a suction opening so as to prevent the electronic component 1 from coming into contact with the suction mechanism 52 when the electronic component 1 is sucked.

What is claimed is:

1. An electronic component conveyance device comprising:
   a conveyance path; and
   a first magnetic force generation unit,
   the conveyance path including a midstream part and a downstream part connected with the midstream part,
   each of the midstream part and the downstream part including a bottom surface, a first sidewall, and a second sidewall, the first and second sidewalls being provided at opposite side edges of the bottom surface in a width direction of the bottom surface,
   the first sidewall and the second sidewall facing each other and being spaced apart with an interval,
   the interval P2 in the width direction between the first sidewall and the second sidewall in the midstream part being larger than the interval P3 in the width direction between the first sidewall and the second sidewall in the downstream part,
   the first magnetic force generation unit being positioned lateral to the first sidewall in the midstream part, and
   a height of a center of the first magnetic force generation unit at the lateral position with respect to the bottom surface in an extending direction which is a direction where at least one of the first and second sidewalls extends from the bottom surface being higher than P3/2.

2. The electronic component conveyance device according to claim 1, further comprising a second magnetic force generation unit provided lateral to the second sidewall in the midstream part and at a side of the bottom surface opposite to the first magnetic force generation unit in the width direction,
   wherein the second magnetic force generation unit is arranged at a farther downstream side than the first magnetic force generation unit.

3. The electronic component conveyance device according to claim 2, wherein a distance between a center of the second magnetic force generation unit and the bottom surface is smaller than a distance in the extending direction between the center of the first magnetic force generation unit and the bottom surface.

4. An electronic component conveyance device comprising:
   a conveyance path; and
   a first magnetic force generation unit,
   the conveyance path including a midstream part and a downstream part connected with the midstream part,
   each of the midstream part and the downstream part including a bottom surface, a first sidewall, and a second sidewall, the first and second sidewalls being provided at opposite side edges of the bottom surface in a width direction of the bottom surface,
   the first sidewall and the second sidewall facing each other and being spaced apart with an interval,
   the interval in the width direction between the first sidewall and the second sidewall in the midstream part being larger than the interval in the width direction between the first sidewall and the second sidewall in the downstream part,
   the first magnetic force generation unit being positioned lateral to the first sidewall in the midstream part, and
   a distance between a center of the first magnetic force generation unit, and the bottom surface in an extending direction which is a direction where at least one of the first and second sidewalls extends from the bottom surface being larger than a distance between a center of an electronic component being conveyed and the bottom surface in the extending direction, at the lateral position.

5. The electronic component conveyance device according to claim 4, further comprising a second magnetic force generation unit provided lateral to the second sidewall in the midstream part and at a side of the bottom surface opposite to the first magnetic force generation unit in the width direction,
wherein the second magnetic force generation unit is arranged at a farther downstream side than the first magnetic force generation unit.

6. The electronic component conveyance device according to claim 5, wherein a distance between a center of the second magnetic force generation unit and the bottom surface is smaller than a distance in the extending direction between the center of the first magnetic force generation unit and the bottom surface.

7. An electronic component conveyance device comprising:
a conveyance path; and
a first magnetic force generation unit provided stationary relative to the conveyance path,
the conveyance path including a bottom surface, a first sidewall, and a second sidewall,
the first sidewall and the second sidewall facing each other and being spaced apart with an interval,
the first magnetic force generation unit being provided lateral to the first sidewall, and
the bottom surface having a separating structure that a portion of a lower surface of an electronic component being conveyed is spaced apart from the bottom surface.

8. The electronic component conveyance device according to claim 7, wherein the separating structure is one of a protrusion defined by a portion of the bottom surface being protruded and a recess defined by a portion of the bottom surface being recessed.

9. The electronic component conveyance device according to claim 7, wherein the separating structure is such a level difference in the bottom surface that the bottom surface is lower on a downstream side.

10. The electronic component conveyance device according to claim 7, wherein the separating structure is a curved surface of the bottom surface.

11. The electronic component conveyance device according to claim 7, wherein
the conveyance path includes a midstream part and a downstream part connected with the midstream part,
the bottom surface, the first sidewall, and the second sidewall define the midstream part and the downstream part,
an interval in a width direction of the bottom surface between the first sidewall and the second sidewall in the midstream part is larger than an interval in the width direction between the first sidewall and the second sidewall in the downstream part,
the first magnetic force generation unit is provided lateral to the first sidewall in the midstream part, and
the separating structure is included in the bottom surface in the midstream part.

12. The electronic component conveyance device according to claim 11, further comprising a second magnetic force generation unit provided lateral to the second sidewall in the midstream part and at a side of the bottom surface opposite to the first magnetic force generation unit in the width direction,
wherein the second magnetic force generation unit is arranged at a farther downstream side than the first magnetic force generation unit.

13. An electronic component conveyance device comprising:
a conveyance path; and
a first magnetic force generation unit provided stationary relative to the conveyance path,
the conveyance path including a bottom surface, a first sidewall, and a second sidewall,
the first sidewall and the second sidewall facing each other and being spaced apart with an interval,
the first magnetic force generation unit being provided lateral to the first sidewall, and
further including a floating mechanism that separates a portion of a lower surface of an electronic component being conveyed off the bottom surface by air pressure.

14. The electronic component conveyance device according to claim 13, wherein the floating mechanism includes a blowing mechanism that blows gas upwardly from the bottom surface.

15. The electronic component conveyance device according to claim 13, wherein the floating mechanism includes a suction mechanism that sucks an electronic component from above.

16. The electronic component conveyance device according to claim 13, wherein
the conveyance path includes a midstream part and a downstream part connected with the midstream part,
the bottom surface, the first sidewall, and the second sidewall define the midstream part and the downstream part,
an interval between the first sidewall and the second sidewall in the midstream part is larger than an interval between the first sidewall and the second sidewall in the downstream part,
the first magnetic force generation unit is provided lateral to the first sidewall in the midstream part, and
the floating mechanism is provided in the midstream part.

17. A method of manufacturing a taping electronic component array, the method comprising steps of:
aligning stack directions of a plurality of internal conductors in the electronic components using the electronic component conveyance device according to claim 1; and
housing the electronic components of which the stack directions are aligned into recesses in a tape to obtain a taping electronic component array including the tape and the electronic components housed in the recesses.

* * * * *